(12) United States Patent
Fujii et al.

(10) Patent No.: US 8,776,334 B2
(45) Date of Patent: Jul. 15, 2014

(54) PIEZOELECTRIC THIN FILM RESONATOR AND MANUFACTURING METHOD THEREOF

(75) Inventors: Hidetoshi Fujii, Ishikawa-ken (JP); Ryuichi Kubo, Ishikawa-ken (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 1292 days.

(21) Appl. No.: 12/053,883

(22) Filed: Mar. 24, 2008

(65) Prior Publication Data

US 2008/0178444 A1 Jul. 31, 2008

Related U.S. Application Data

(60) Division of application No. 11/714,870, filed on Mar. 7, 2007, now abandoned, which is a continuation of application No. PCT/JP2005/022300, filed on Dec. 5, 2005.

(30) Foreign Application Priority Data

Dec. 24, 2004 (JP) ................................. 2004-373761

(51) Int. Cl.
*H01L 41/22* (2013.01)
*H01L 41/083* (2006.01)

(52) U.S. Cl.
USPC ............. 29/25.35; 29/594; 29/831; 29/846; 216/67; 204/192.32; 204/192.34

(58) Field of Classification Search
USPC ......... 29/25.35, 594, 831, 842, 846; 310/320, 310/324; 216/67; 204/192.32, 192.34
See application file for complete search history.

(56) References Cited

U.S. PATENT DOCUMENTS 4,639,288 A * 1/1987 Price et al. ............ 204/192.32 X
6,051,907 A * 4/2000 Ylilammi .................. 310/324 X
(Continued)

FOREIGN PATENT DOCUMENTS

JP 58058281 A * 4/1983 .................. 216/67 X
JP 61218214 A * 9/1986
(Continued)

OTHER PUBLICATIONS

Chisen et al., WO 2002/093549, "Thin Film Acoustic Resonator has Sandwiched Structural Body Formed of a Piezoelectric Body Layer and a Lower Electrode and an Upper Electrode Stuck on the Both Surfaces Thereof is Disposed so as to Bridge the Recess", Nov. 2002.*

(Continued)

Primary Examiner — A. Dexter Tugbang
(74) Attorney, Agent, or Firm — Dickstein Shapiro LLP

(57) ABSTRACT

A method of manufacturing a piezoelectric thin film resonator which can reduce variations in resonant frequency and resonant resistance by uniformly planarizing a structural film. The method of manufacturing the piezoelectric thin film resonator includes the steps of forming sacrifice layer patterns on an upper surface of a mother substrate; forming a dielectric film on the sacrifice layer patterns; processing a surface of the dielectric film by a plasma treatment; forming vibration portions on the dielectric film, the vibration portions each being composed of two excitation electrodes and a piezoelectric thin film provided therebetween; etching the sacrifice layer patterns; and cutting the mother substrate into separate piezoelectric thin film resonators.

5 Claims, 2 Drawing Sheets

(56) References Cited

U.S. PATENT DOCUMENTS

| | | | |
|---|---|---|---|
| 6,377,137 B1 * | 4/2002 | Ruby | 29/25.35 X |
| 6,839,946 B2 * | 1/2005 | Ylilammi et al. | 29/846 X |
| 6,842,088 B2 * | 1/2005 | Yamada et al. | 310/324 X |
| 6,992,420 B2 * | 1/2006 | Jang et al. | 310/324 |
| 7,212,082 B2 * | 5/2007 | Nagao et al. | 310/324 X |
| 2002/0127880 A1 * | 9/2002 | Tanaka et al. | 438/783 |
| 2002/0190814 A1 * | 12/2002 | Yamada et al. | 310/324 X |
| 2003/0132683 A1 * | 7/2003 | Yamada et al. | 310/346 |
| 2004/0251236 A1 * | 12/2004 | Zhang et al. | 216/67 |

FOREIGN PATENT DOCUMENTS

| | | | | |
|---|---|---|---|---|
| JP | 05347284 A | * | 12/1993 | |
| JP | 09-64675 | * | 3/1997 | |
| JP | 2000069594 A | * | 3/2000 | |
| JP | 2001-44188 | | 2/2001 | |
| JP | 2001044188 A | * | 2/2001 | |
| JP | 2001203558 A | * | 7/2001 | |
| JP | 2001-211053 | | 8/2001 | |
| JP | 2001211053 A | * | 8/2001 | |
| JP | 2001279438 A | * | 10/2001 | |
| JP | 2002100628 A | * | 4/2002 | |
| JP | 2002372974 A | * | 12/2002 | |
| JP | 2003318695 A | * | 11/2003 | |
| JP | 2004048639 A | * | 2/2004 | |
| JP | 2004312201 A | * | 11/2004 | |
| JP | 2004356700 A | * | 12/2004 | |

OTHER PUBLICATIONS

International Search Report from corresponding International application dated Mar. 14, 2006.
The Written Opinion from corresponding International application dated Mar. 14, 2006.

* cited by examiner

PIEZOELECTRIC THIN FILM RESONATOR AND MANUFACTURING METHOD THEREOF

CROSS REFERENCE TO RELATED APPLICATIONS

The present application is a divisional of application Ser. No. 11/714,870, filed Mar. 6, 2007, which is a continuation of International Application No. PCT/JP2005/022300, filed Dec. 5, 2005, claiming priority to Japanese Patent Application No. JP2004-373761, filed Dec. 24, 2004, the entire contents of each of these applications being incorporated herein by reference in their entirety.

FIELD OF THE INVENTION

The present invention relates to a piezoelectric thin film resonator and a manufacturing method thereof.

BACKGROUND OF THE INVENTION

In a so-called air-bridge type piezoelectric thin film resonator, in order to acoustically separate a vibration portion, which is formed of a pair of excitation electrodes facing each other and a piezoelectric thin film provided therebetween, from a substrate, the structure is formed in which a thin film member (membrane) partly floats over the substrate with an airspace layer provided there between.
Patent Document 1: Japanese Unexamined Patent Application Publication No. 61-218214

Heretofore, planarization has not been studied for an air-bridge type piezoelectric thin film resonator.

The orientation property of a piezoelectric thin film influences resonant properties. In order to improve the resonant properties, the orientation property of a piezoelectric thin film must be improved, and in order to improve the orientation property thereof, the flatness of a structural film, which is provided under an excitation electrode, must be improved.

As a method for planarizing the structural film provided under the excitation electrode, for example, polishing by CMP (chemical mechanical polishing) may be mentioned.

In an air-bridge type piezoelectric thin film resonator, a structural film is formed on a sacrifice layer which is used for forming an airspace layer. Hence, irregularities are formed on the structural film which is to be polished. By polishing, convex portions (projecting surfaces) can only be planarized, and in addition, since slurry is trapped in concave portions, peripheries of the convex portions are likely to be polished as compared to central portions thereof. Accordingly, even when the structural film on the sacrifice layer is polished, film-thickness distribution is generated, and as a result, superior resonant properties cannot be obtained. In order to avoid this problem, a method may be used in which after a burying material is buried in concave portions, planarization is performed by CMP, and the burying material is then removed; however, in this case, the manufacturing process becomes complicated, and hence the manufacturing cost is increased.

In addition, when a plurality of piezoelectric thin film resonators is simultaneously formed using a wafer, it is difficult to uniformly polish structural films of individual resonators in the wafer on the order of nanometers in thickness. The resonant frequency and the resonant properties of a resonator largely depend on the thickness of the structural film. When the thicknesses of the structural films vary within a wafer, the yield may be decreased, or the number of steps, such as frequency adjustment, may be increased, and as a result, the manufacturing cost is increased.

SUMMARY OF THE INVENTION

The present invention has been conceived in consideration of the above circumstances, and an object of the present invention is to provide a piezoelectric thin film resonator having superior resonant properties by uniformly planarizing a structural film and a manufacturing method of the above piezoelectric thin film resonator.

In order to achieve the above object, the present invention provides a piezoelectric thin film resonator having the following structure.

The piezoelectric thin film resonator includes a substrate having at least one flat major surface; a dielectric film having two support portions supported by the major surface of the substrate and a floating portion which is connected to the support portions and which is disposed over the major surface of the substrate with an airspace layer provided therebetween; and a vibration portion which is formed of a pair of electrodes and a piezoelectric thin film provided therebetween and which is provided on the floating portion of the dielectric film at a side opposite to the airspace layer. In this piezoelectric thin film resonator, a surface of the dielectric film which is located at a side opposite to the substrate is planarized by a plasma treatment using an inert gas or a gas containing an element forming the dielectric film.

According to the structure described above, since the dielectric film is planarized by a plasma treatment, the orientation property of the excitation electrode formed on the dielectric film is improved, and hence the orientation property of the piezoelectric thin film formed on the excitation electrode is also improved. Since the orientation property of the piezoelectric thin film is improved, variations in resonant properties and resonant resistance can be reduced. In addition, since the orientation property of the excitation electrode is improved, a piezoelectric thin film resonator having superior resistance against electric power can be formed.

In addition, when a plurality of piezoelectric thin film resonators is simultaneously formed using a wafer, the thickness of the structural film of each resonator can be controlled on the order of nanometers. Accordingly, since variation in resonant frequency in the wafer surface and the resonant properties can be controlled with high accuracy, the yield can be increased, and hence the manufacturing cost can be reduced.

Furthermore, since a plasma treatment is performed using an inert gas or a gas containing an element forming the dielectric film, the dielectric film can be planarized without forming a compound layer thereon which is different from a dielectric material.

The dielectric film is preferably a film formed of a material selected from the group consisting of $Si_3N_4$, $SiO_2$, and $Al_2O_3$.

According to the above structure, since the dielectric film is an amorphous film, planarization can be easily performed by a plasma treatment.

In addition, the present invention provides the following method for manufacturing piezoelectric thin film resonators.

The method for manufacturing piezoelectric thin film resonators, includes: i) a first step of forming sacrifice layer patterns on an upper surface of a mother substrate; ii) a second step of forming a dielectric film on the sacrifice layer patterns; iii) a third step of processing a surface of the dielectric film by a plasma treatment; iv) a fourth step of forming vibration portions on the dielectric film, the vibration portions each being composed of two excitation electrodes and a piezoelectric thin film provided therebetween; v) a fifth step of etching the sacrifice layers; and vi) a sixth step of cutting the mother substrate to separate the piezoelectric thin film resonators.

Since the dielectric film is planarized in the above third step, the orientation property of the excitation electrode formed on the dielectric film is improved, and the orientation property of the piezoelectric thin film formed on the excitation electrode is also improved. Since the orientation property of the piezoelectric thin film is improved, a piezoelectric thin film resonator having superior resonant properties can be manufactured.

The third step described above preferably includes the substeps of: a) fitting the mother substrate provided with the dielectric film formed thereon to a substrate plate and then placing the mother substrate in a sputtering chamber; b) supplying a gas in the sputtering chamber; and c) performing sputtering etching of the surface of the dielectric film, which is formed on the mother substrate fitted to the substrate plate, with plasma of the gas generated by supplying an RF voltage to the substrate plate while the substrate plate is being electrically floated from the sputtering chamber.

In this case, in the third step, the dielectric film can be planarized without forming a compound layer thereon which is different from a dielectric material. In addition, a dielectric film patterning step can be stably performed when etching holes are formed.

In particular, the following embodiments may be mentioned.

As one embodiment, the gas may be an inert gas selected from the group consisting of Ar and He.

As another embodiment, the gas may be a gas containing an element forming the dielectric film.

In said another embodiment, the dielectric film is preferably formed of $SiO_2$ or $Al_2O_3$, and oxygen is preferably used as the gas. In this case, since the insulating properties are excellent, the resonant properties are not degraded.

In said another embodiment, the dielectric film is preferably formed of $Si_3N_4$, and nitrogen is preferably used as the gas. In this case, since the insulating properties are excellent, the resonant properties are not degraded.

According to the piezoelectric thin film resonator and the manufacturing method thereof, by uniformly planarizing the structural film, a resonator having superior resonant properties can be obtained.

Figure 1:
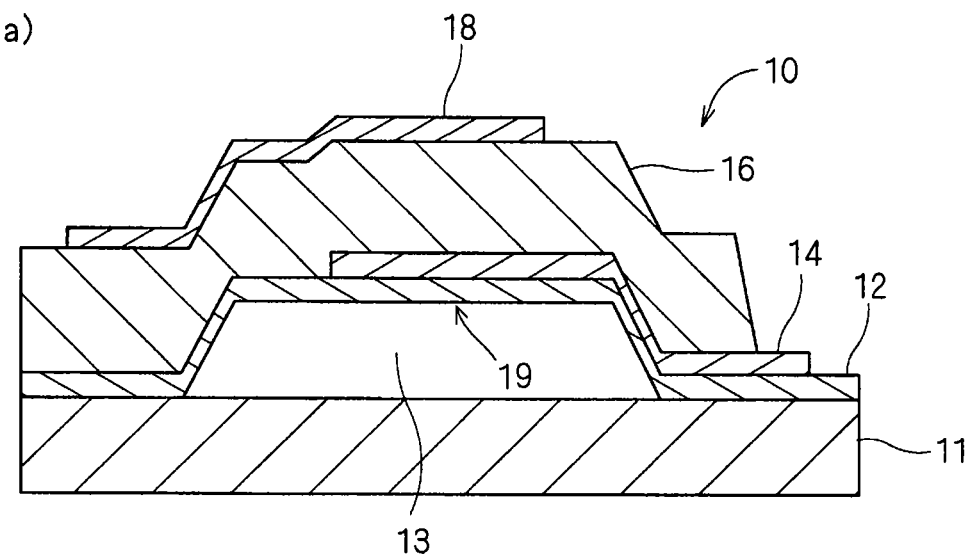
FIG. 1(a) is a cross-sectional view of a piezoelectric thin film resonator.
FIG. 1(b) is a plan view thereof (example).
Figure 1:
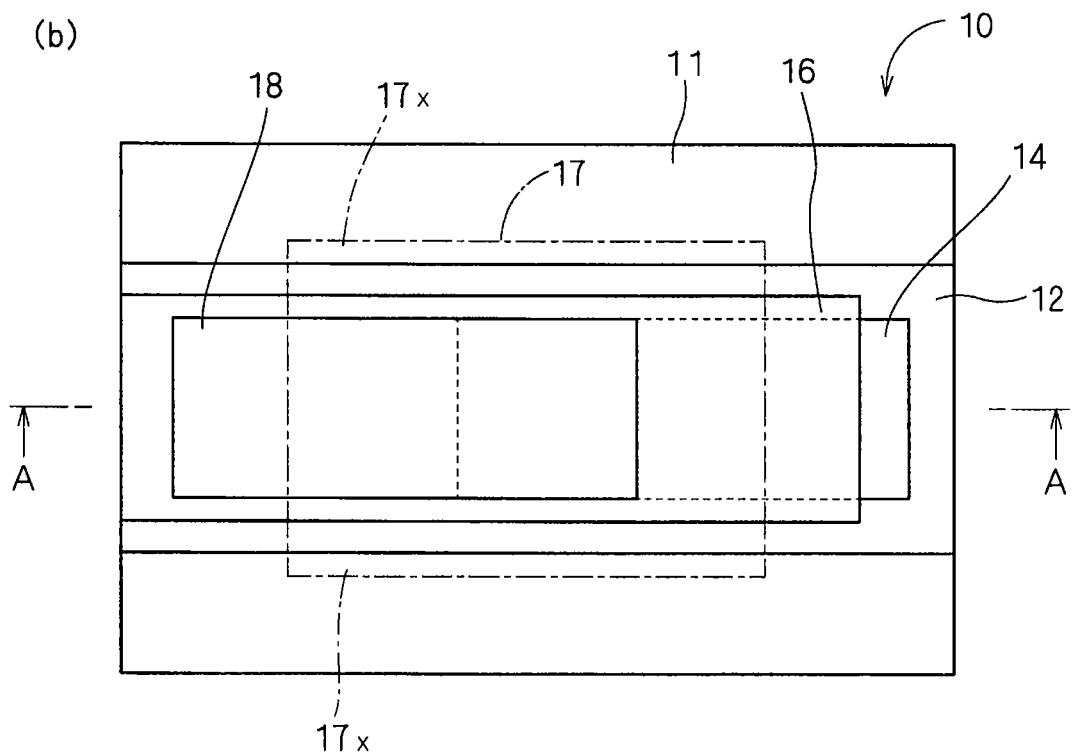

REFERENCE NUMERALS 10, 10a piezoelectric thin film resonator
11 substrate
13 airspace layer
14 lower electrode (excitation electrode)
16 piezoelectric thin film
17 sacrifice layer
17x end portion
18 upper electrode (excitation electrode)
19 vibration portion

DETAILED DESCRIPTION OF THE INVENTION

Hereinafter, examples will be described as embodiments according to the present invention with reference to FIG. 1.

FIG. 1(a) is a cross-sectional view taken along the line A-A in FIG. 1(b), and FIG. 1(b) is a plan view.

As schematically shown in FIG. 1, a piezoelectric thin film resonator 10 is formed of a substrate 11 and a thin film member (membrane) provided thereon, the thin film member including a dielectric film 12, a lower electrode 14, a piezoelectric thin film 16, and an upper electrode 18. An airspace layer 13 (see FIG. 1(a)) is formed between the substrate 11 and the dielectric film 12. The dielectric film 12 includes support portions supported by the substrate 11 and a floating portion floating over the substrate 11. On the floating portion of the dielectric film 12 at a position opposite to the airspace layer 13, a vibration portion 19 floating over the substrate 11 is formed in a region in which the electrodes 14 and 18 are overlapped with each other. The vibration portion 19 is composed of parts of the lower electrode 14, the piezoelectric thin film 16, and the upper electrode 18, which are present in the above region. The airspace layer 13 is formed by removing a sacrifice layer 17 (see FIG. 1(b)) which is formed between the substrate 11 and the dielectric film 12.

Next, a manufacturing method of the piezoelectric thin film resonator 10 will be described.

<Sacrifice Layer>

First, the sacrifice layer 17 is formed on the substrate 11. As the substrate 11, a substrate which is inexpensive and which has superior machinability is used. A Si or a glass substrate having a flat surface is more preferable. On this substrate 11, by methods such as a sputtering method and a photo-etching method, the sacrifice layer 17 for forming an airspace layer is formed using, for example, zinc oxide which is likely to be chemically dissolved.

As a material for the sacrifice layer 17, it is preferably used the material can withstand a high temperature generated when the piezoelectric thin film 16 is formed, and which can be easily removed. For example, a metal such as Ge, Sb, Ti, Al, or Cu, a malate silicate glass (PSG), or a polymer may be used. As the polymer, for example, polytetrafluoroethylene or its derivative, poly(phenylene sulfide), poly(ether ether ketone), polyimide, poly(imide siloxane), vinyl ether, polyphenyl, parylene-n, parylene-f, or benzocyclobutene is preferable.

The sacrifice layer 17 should have a sufficient thickness so that the vibration portion 19 is not brought into contact with the substrate 11 even when the membrane is warped. For easy formation, the thickness of the sacrifice layer 17 is preferably in the range of 50 nm to several micrometers. In addition, the minimum distance between the vibration portion 19 and an end portion 17x of the sacrifice layer 17 is set to be not more than 50 times the thickness of the vibration portion 19.

<Formation of Dielectric Film>

Next, the dielectric film 12 is formed. The dielectric film 12 is formed so as to cover the entire surface of the substrate 11 by a method such as sputtering, CVD, or electron beam deposition. This dielectric film 12 has an effect of protecting the vibration portion 19, which includes the electrodes 14 and 18 and the piezoelectric thin film 16, and may be formed using a nitride such as silicon nitride having superior passivation properties or an oxide such as silicon oxide.

In addition, for this dielectric film 12, when a material having a temperature coefficient of frequency (TCF) opposite to that of a material used for the piezoelectric thin film 16 is used, the change in frequency with respect to the change in temperature of a resonator or a filter is decreased, and hence the properties are improved. For example, when zinc oxide or aluminum nitride is used for the piezoelectric thin film, silicon oxide having a TCF opposite to that thereof may be used.

In addition, aluminum nitride which is an insulating material and which has high thermal conductivity may also be used.

This dielectric film 12 is planarized in a subsequent step. As a material suitable for the planarization, an insulating film may be used, and as a preferable material, for example, an amorphous material such as silicon nitride, silicon oxide, or aluminum oxide may be used.

<Planarization of Dielectric Film>

Next, the dielectric film 12 is planarized. That is, the dielectric film 12 is planarized by dry etching.

As the dry etching, either ion etching or plasma etching may be performed. In the case of ion etching, an inert gas such as Ar or He is discharged by RF power, and sputtering etching is performed by self-bias, so that planarization may be performed. That is, by plasma (electrons and positive ions) generated by supplying an RF voltage to a substrate plate (electrically floating from a sputtering chamber) in the sputtering chamber, the substrate plate is biased to a negative potential with respect to a standard potential, so that sputtering etching is performed.

In the case in which the dielectric material is an oxide such as silicon oxide, an oxygen gas may be used. Positive ions are $Ar^+$ ions when the gas is argon and are $O^+$, $O_2^+$ (two-atom ion) and the like when the gas is oxygen. In addition, planarization may be performed by reactive ion etching using a chemically active gas such as a halogen compound. Since a plasma treatment is performed using an inert gas or a gas containing an element forming a dielectric film, the dielectric film 12 can be planarized without forming a compound layer thereon which is different from a dielectric material.

A preferable surface roughness (Ra) of the dielectric film 12 is 2.0 nm or less. This surface roughness (Ra) is called an arithmetic average roughness and is an average value obtained such that a standard length L is extracted from a roughness measurement curve in a direction of its average line, and the absolute values of deviations from the average line of this extracted portion to a measurement curve are summed and averaged.

As one example of plasma treatment conditions, when an $SiO_2$ film is processed at an RF power of 6 mW/mm$^2$ for a treatment time of 10 minutes using an $O_2$ gas, an initial surface roughness Ra of 2 to 10 nm is improved to a surface roughness Ra of 2 nm or less by the treatment.

$SiO_2$ is obtained as an amorphous material by common sputtering. Even when the same treatment as described above is performed for a ZnO film which is likely to be uniaxially oriented, the surface roughness is not so much improved.

<Formation of Lower Electrode>

Next, the lower electrode 14 is formed on the dielectric film 12 processed by the planarization treatment. The lower electrode 14 is formed by film formation using sputtering, plating, CVD, electron beam deposition or the like, followed by patterning using a photolithographic technique. The lower electrode 14 is primarily formed from a metal material, such as Mo, Pt, Al, Au, Cu, or Ti, to have a belt shape extending from the sacrifice layer 17 to one side of the substrate 11 (right side in the figure). Since the dielectric film 12, which is a layer provided below the lower electrode 14, is planarized, the lower electrode 14 can be formed to have a flat surface. A preferable surface roughness (Ra) of the lower electrode 14 is 2.0 nm or less.

<Formation of Piezoelectric Thin Film>

Next, the piezoelectric thin film 16 is formed on the lower electrode 14. By film formation using sputtering or the like and by lift-off using patterning by a photolithographic technique, the piezoelectric thin film 16 is formed using zinc oxide, aluminum nitride, or the like. When aluminum nitride is used for forming the piezoelectric thin film 16, by lift-off using zinc oxide, aluminum nitride is patterned. Since the dielectric film 12 of silicon oxide or the like is formed over the entire surface of the sacrifice layer 17 formed of zinc oxide, although zinc oxide used for lift-off is wet-etched when it is patterned or when aluminum nitride is processed by lift-off, zinc oxide used for forming the sacrifice layer 17 is not etched.

<Formation of Upper Electrode>

Next, the upper electrode 18 is formed. The upper electrode 18 is formed on the piezoelectric thin film 16 in a manner similar to that for the lower electrode 14. The upper electrode 18 is formed to have a belt shape extending from the piezoelectric thin film 16 to the other side of the substrate 11 (left side in the figure).

<Formation of Etching Hole>

Figure 2:
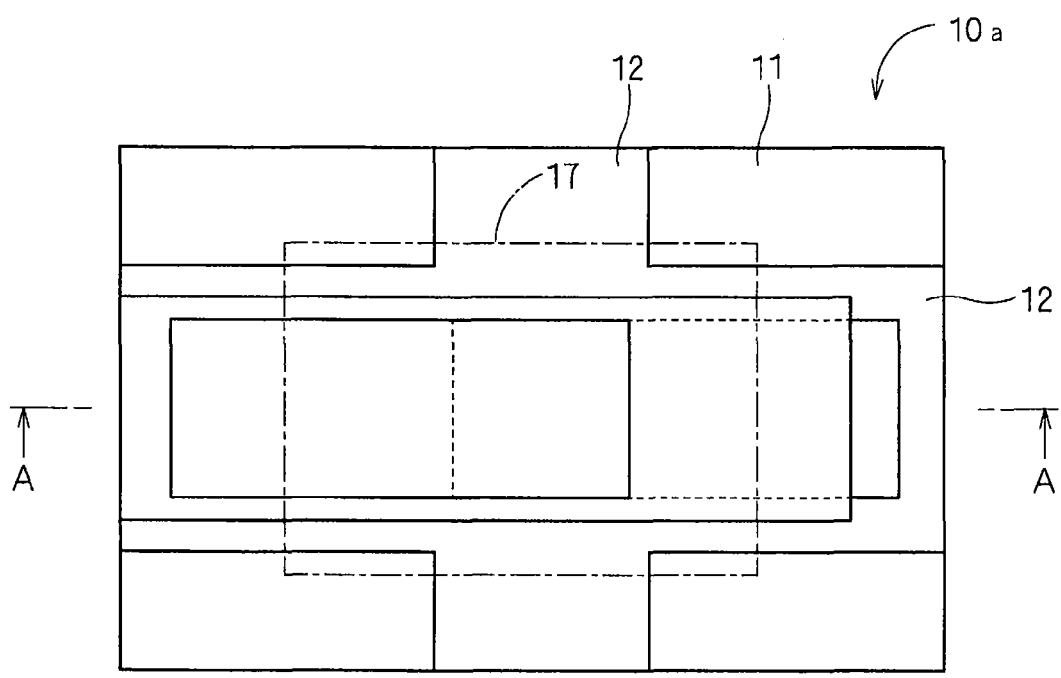
FIG. 2 is a plan view of a piezoelectric thin film resonator, which corresponds to FIG. 1(b) (modified example).

Next, etching holes, which are penetrating portions for exposing the sacrifice layer 17, are formed. After a photoresist or the like is patterned by photolithography, by reactive ion etching (RIE), wet etching, or the like, parts of the dielectric film 12 provided on the sacrifice layer 17, which are not covered with a photoresist pattern, are removed. A photoresist pattern shown in FIG. 1(b) has a rectangular shape covering the lower electrode 14, the piezoelectric thin film 16, and the upper electrode 18. The end portions 17x of the sacrifice layer 17 under the insulating film 12 are extended outside from the resist pattern. The photoresist pattern may have a cross-shape as shown in FIG. 2. For example, when silicon oxide is used for the dielectric film 12, reactive ion etching is performed using a fluorinated gas such as $CF_4$. Alternatively, wet etching may be performed using a hydrofluoric acid solution. After the etching, an etching mask such as a photoresist is removed using an organic solvent such as acetone. Dry etching using oxygen plasma may also be performed.

<Formation of Airspace Layer>

Next, the sacrifice layer 17 is etched, so that the airspace layer 13 is formed. After a photoresist or the like is patterned by photolithography, by reactive ion etching, wet etching, or the like, the sacrifice layer 17 is removed. For example, when zinc oxide is used for forming the sacrifice layer 17, it is removed using an acidic solution containing hydrochloric acid, phosphoric acid, or the like. After the etching, an etching mask such as a photoresist is removed using an organic solvent such as acetone. When the sacrifice layer 17 is etched using a solution which does not etch the piezoelectric thin film 16, the dielectric film 12, and the electrodes 14 and 18, a process including patterning by photolithography and removal of an etching mask can be omitted. For example, when aluminum nitride is used for the piezoelectric thin film 16, silicon oxide is used for the dielectric film 12, and Pt, Au, Ti, or the like is used for the electrodes 14 and 18, zinc oxide forming the sacrifice layer 17 can be removed by a mixed aqueous solution composed, for example, of acetic acid and phosphoric acid without performing patterning. After the etching, replacement using a volatile solution such as pure water or IPA is sufficiently performed, followed by drying, so that the airspace layer 13 is formed.

When mass production of the piezoelectric thin film resonator 10 is performed, the piezoelectric thin film resonators 10 are simultaneously formed by the above manufacturing method using a wafer (mother substrate) as the substrate 11 and are then separated by dicing or the like, so that individual piezoelectric thin film resonators 10 are obtained. Alternatively, after a packaging substrate having lands is prepared, and the upper and the lower electrodes of the mother substrate are bonded to the lands by bump-bonding before individual piezoelectric thin film resonators are separated by cutting, the peripheries of the piezoelectric thin film resonators may be encapsulated for packaging.

The piezoelectric thin film resonator 10 thus described has the following operations and advantages.

(1) Since the dielectric film 12 used as an underlayer provided below the lower electrode 14 is planarized, the lower electrode 14 can be formed to be flat and to have a superior orientation property, and the piezoelectric thin film 16 having superior quality can be formed thereon; hence, the piezoelectric thin film resonator 10 having superior properties can be obtained. In addition, since the orientation property of the lower electrode 14 is improved, the piezoelectric thin film resonator 10 can be formed to have superior resistance against electric power.

(2) Since a dry process is used for planarization instead of CMP, the thickness of the dielectric film 12, which is used as an underlayer provided below the lower electrode 14, can be uniformly controlled on the order of nanometers in the substrate surface. Accordingly, since the variation in resonant frequency in the wafer surface and the resonant properties can be controlled with high accuracy, the yield can be increased, and hence the manufacturing cost can be reduced.

That is, the resonant frequency and the resonant properties of a resonator considerably depend on the thickness of its constituent film. When the thickness of the constituent film varies in a wafer surface, the yield may be decreased, and/or the number of steps such as frequency adjustment may be increased; hence, as a result, the manufacturing cost is increased. When a plurality of resonators is simultaneously formed using a wafer, the thickness of the constituent film of each resonator can be controlled on the order of nanometers by a plasma treatment, and hence the variation in resonant frequency in the wafer surface and the resonant properties can be controlled with high accuracy. As a result, the yield can be increased, and the manufacturing cost can be reduced.

(3) In the case in which zinc oxide is used both for the sacrifice layer 17 for forming the airspace layer 13 and a lift-off mask used when the piezoelectric thin film 16 made of aluminum nitride is formed, when the dielectric film 12 is formed over the entire surface of the sacrifice layer 17 when aluminum nitride is patterned, the shape of the sacrifice layer 17 is not damaged when the aluminum nitride is processed by lift-off.

(4) When structural films other than the sacrifice layer 17 have resistance against an etching solution for the sacrifice layer 17, a patterning step for sacrifice-layer etching can be omitted, and as a result, because of process stabilization and decrease in number of steps, the cost can be reduced.

(5) After the sacrifice layer 17 is wet-etched, the etchant is sufficiently replaced with a volatile solution such as pure water or IPA. When the replacement is performed using a volatile solution, time required for a drying step following the removal of the sacrifice layer can be reduced, and hence the cost can be reduced.

The present invention is not limited to the above examples, and various modifications may be performed without departing from the scope of the present invention. The present invention may also be applied to a ladder type and a lattice type piezoelectric filter using a plurality of piezoelectric thin films.

The invention claimed is:

1. A method for manufacturing piezoelectric thin film resonators, the method comprising:
    forming sacrifice layer patterns on an upper surface of a mother substrate;
    forming a dielectric film on the sacrifice layer patterns;
    processing a surface of the dielectric film by a plasma treatment so as to flatten the surface of the dielectric film,
    forming vibration portions on the dielectric film, the vibration portions each being composed of two excitation electrodes and a piezoelectric thin film provided therebetween;
    etching the sacrifice layer patterns; and
    cutting the mother substrate into separate piezoelectric thin film resonators,
    wherein the step of processing the surface of the dielectric film comprises:
        fitting the mother substrate provided with the dielectric film formed thereon to a substrate plate;
        placing the mother substrate in a sputtering chamber;
        supplying a gas in the sputtering chamber; and
        performing sputtering etching of the surface of the dielectric film with plasma of the gas generated by supplying an RF voltage to the substrate plate while the substrate plate is electrically floated from the sputtering chamber.

2. The method for manufacturing piezoelectric thin film resonators, according to claim 1, wherein the gas is an inert gas selected from the group consisting of Ar and He.

3. The method for manufacturing piezoelectric thin film resonators, according to claim 1, wherein the gas is a gas comprising an element forming the dielectric film.

4. The method for manufacturing piezoelectric thin film resonators, according to claim 3, wherein the dielectric film is formed of $SiO_2$ or $Al_2O_3$, and oxygen is used as the gas.

5. The method for manufacturing piezoelectric thin film resonators, according to claim 3, wherein the dielectric film is formed of $Si_3N_4$, and nitrogen is used as the gas.

* * * * *